United States Patent [19]
Danysh et al.

[11] Patent Number: 5,262,611
[45] Date of Patent: Nov. 16, 1993

[54] APPARATUS FOR ION-PLASMA MACHINING WORKPIECE SURFACES INCLUDING IMPROVED DECELERATING SYSTEM

[75] Inventors: Sergey V. Danysh; Alexey N. Lobanov; Andrey V. Obukhov; Vladimir A. Obukhov, all of Moscow, U.S.S.R.

[73] Assignee: Hauzer Holding BV, Pa Venlo, Netherlands

[21] Appl. No.: 707,526

[22] Filed: May 30, 1991

[30] Foreign Application Priority Data
Jun. 26, 1990 [SU] U.S.S.R. ............................ 4842715

[51] Int. Cl.$^5$ .......................... B23K 9/00; H01J 37/08
[52] U.S. Cl. .......................... 219/121.43; 219/121.52; 204/298.05; 204/192.11
[58] Field of Search ............. 219/121.43, 121.52, 219/123; 156/345, 614, 613, 643; 204/298.04, 298.05, 192.11

[56] References Cited

U.S. PATENT DOCUMENTS

| | | |
|---|---|---|
| 3,740,554 | 6/1973 | Morgan, Jr. ............... 204/298.38 |
| 5,016,563 | 5/1991 | Murakami et al. ............... 156/614 |
| 5,136,171 | 8/1992 | Leung et al. ............... 204/298.37 |

*Primary Examiner*—Mark H. Paschall
*Attorney, Agent, or Firm*—Townsend and Townsend

[57] ABSTRACT

Apparatus comprises a vacuum chamber (1) accommodating a source (2) of ion flow directed toward the surface being machined, and a system (3) for decelerating ion flow. The system (3) includes a shielding electrode (5) positioned before the workpieces (4) and having a hole (7) for the passage of ion flow, and at least one decelerating electrode (6) electrically insulated from the walls of the vacuum chamber (1) and shielding electrode (5). The decelerating electrode (6) has the form of a magnetic element whose magnetization vector ($\overline{M}$) is substantially congruent with the workpiece surface being machined. In addition, line (13) of electron drift current is closed in a direction transverse of the direction of the ion flow.

13 Claims, 5 Drawing Sheets

APPARATUS FOR ION-PLASMA MACHINING WORKPIECE SURFACES INCLUDING IMPROVED DECELERATING SYSTEM

This invention relates generally to ion-plasma technology, and more particularly to apparatus for ion-plasma machining workpieces surfaces.

The invention can be used with success for designing production units intended to fabricate parts to be used in microelectronics, optics, superhigh-frequency equipment, and the like by ion-plasma machining, such as by applying a flow of ions to workpiece surfaces.

There is known an apparatus for ion-plasma machining workpieces, such as depositing oxide films in an oxygen atmosphere by atomizing a material with an ion beam (cf., D. T. Wei "Ion Beam Interference Coating for Ultralow Optical Loss", Applied Optics, vol. 28, No. 14, 1989, pp. 2813 to 2816). This apparatus comprises a vacuum chamber accommodating a source of ion flow directed toward the target to deposit the material on the substrate. However, this apparatus makes use of a relatively high energy source of ions (several keV), such as a Kauffman source of ions.

Many production processes necessitate ion beams of substantially lower energy. For example, there is known an apparatus for ion-plasma machining workpiece surfaces (cf., EP, B, 0021140) comprising a vacuum chamber accommodating a source of ion flow directed toward the surface to be machined. This apparatus is intended for ionic etching (atomization) of substrates from silicon-containing material with an ion flow of low energy ($\sim 100$ eV). Workpieces facing by their surfaces toward the ion flow source are located in a fastening arrangement. As ions of low energy engage with the workpiece surface, the material is atomized without inflicting tangible radiation damage to the crystal material. For increasing the rate of atomization use can be made of ions of chemically active gases, such as freons. In order to obtain a monoenergetic ion flow, a source of ions with plasma emitter and a single-electrode system for ion acceleration are used.

However, this prior art apparatus fails to produce active ion flows with an energy below 100 eV, because the intensity of ion flow (flow density) is limited by the action of spatial charge of ions, and because of the ultimate perveance of beam $P = I_b U_o$, where $I_b$ is the ion beam current [A], and $U_o$ is the volt equivalent of ion energy [B] obtainable by an electrostatic acceleration system. Therefore, in response to a reduction in the energy ($U_o$) of ions the flow of ion beam and density of ion flow are diminished proportionally to $U_o^{3/2}$. Reduced current in turn causes a slower rate of machining and lower efficiency of the process. In practice, this leads to a failure to machine workpieces at ion energy below 100 eV thereby limiting production capabilities of the apparatus.

There are known systems for decelerating ion flow with closed drift of electrons (cf., "Tonnye inzhektory i plazmennye uskoriteli", in Russian, edited by A. I. Morozov and N. N. Semashko, 1990, the Energoatomizdat Publishers, Moscow, pp. 213 to 217) comprising a magnetic system for excitation of a magnetic field across the flow of ions in an annular passage, and an annular decelerating electrode. These systems are generally applicable for decelerating narrow ($\sim 1$ cm thick) tubular ion flows, and for this reason cannot be used in ion-plasma units.

The present invention aims at providing an apparatus for ion-plasma machining workpiece surfaces capable of carrying out processes requiring the action of high-intensity monokinetic beams of low energy through decelerating ion flow by an electric field produced in proximity to the workpiece surface being machined counter to the flow of ions.

The aim of the invention is attained by that in an apparatus for ion-plasma machining workpiece surfaces comprising a vacuum chamber accommodating a source of ion flow orientated toward the workpiece surface being machined, according to the invention, there is provided a system for decelerating ion flow with closed electron drift current including a shielding electrode having a hole for the passage of ion flow to workpiece surface machining zone, at least one decelerating electrode electrically insulated from the walls of the vacuum chamber and from shielding electrode having the form of a magnetic element whose magnetization vector is substantially congruent with the surface of the workpiece being machined secured thereon, line of electron drift current being closed in a direction transverse to the direction of the ion flow.

To facilitate piece-by-piece machining of workpieces, it is preferable that the decelerating electrode be fashioned as a magnetic element fabricated from a magnetically hard material in the form of a rectangular prism, fastening units thereof in the vacuum chamber being positioned at least at one of its magnetic poles.

To facilitate machining a group of workpieces by a wide ion flow aimed at increasing the efficiency of the machining process and in the presence of more than one decelerating electrode, each such electrode is preferably fashioned as a magnetic element of annular shape fabricated from a magnetically hard material, such elements being preferably positioned with like magnetic poles toward each other.

For attaining higher rates of ion deceleration the decelerating electrode is preferably fabricated from a material posessing a high coersive force, such as $SmCo_6$.

To reduce the cost of the proposed apparatus, it is advantageous that the decelerating electrode be fabricated from a dielectric magnetic material, this electrode being preferably enclosed into a casing fabricated from an electrically conductive material.

For reducing erosion of the decelerating electrodes, the shielding electrode should preferably have the form of a flat membrane positioned in front of the workpiece surface being machined.

A reduction in the frequency of possible breakdowns in the deceleration system can be attained by fashioning the shielding electrode as a box-like housing accommodating at least one decelerating electrode, the hole for the passage of ion flow being preferably provided in a wall facing the workpiece surface being machined.

The effect of magnetic field of the deceleration system on operation of the ion flow source can be diminished if the shielding electrode is fabricated from a magnetically soft ferromagnetic material.

For ensuring a higher stability of the proposed apparatus in operation it is preferably provided with an electron emitter positioned between the ion flow source and shielding electrode.

Desirably, the apparatus is provided with a source of direct current whose positive terminal is connected to the decelerating electrode, and negative terminal is connected to the shielding electrode, which allows to control the rate of deceleration of ions.

Alternatively, the shielding electrode can be earthed, which stabilizes operation of the apparatus.

To bring the process of applying the coating material to and chemical reactions at the surface of workpieces into coincidence, it is advisable that the apparatus be provided with at least one source of atoms of the material of the coating orientated toward the workpiece surface being machined.

The proposed apparatus for ion-plasma machining workpiece surfaces provided with an ion flow deceleration system offers wider ion-plasma machining capabilities thanks to reducing the energy of ions.

The invention will now be described in greater detail with reference to specific preferred embodiments thereof taken in conjunction with the accompanying drawings, in which.

Figure 1:
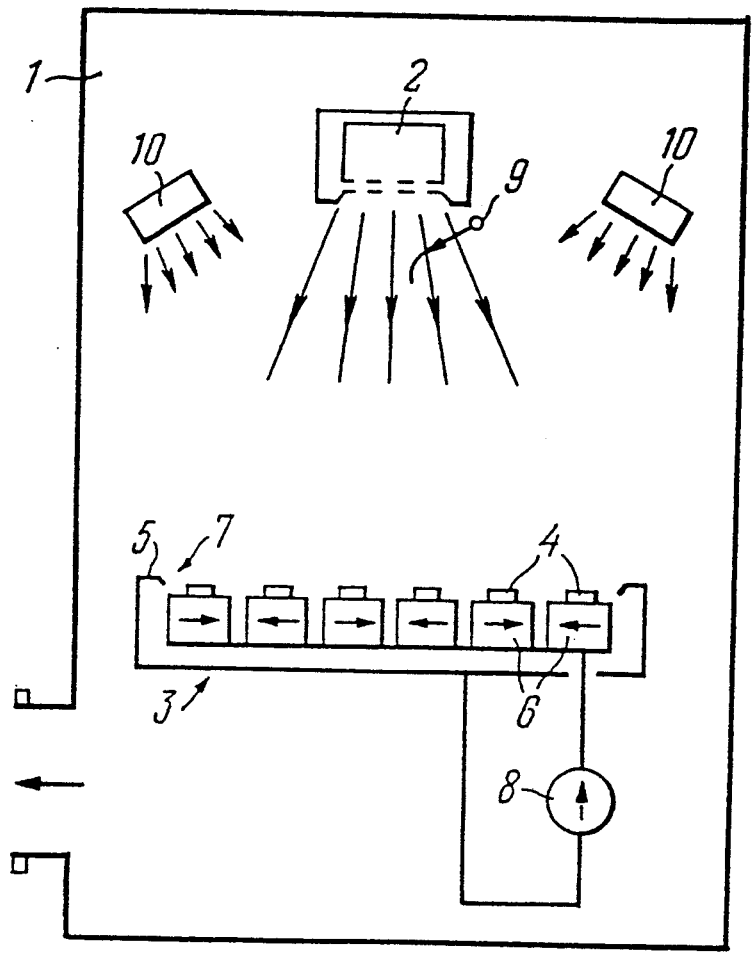
FIG. 1 is a general view of the proposed apparatus for ion-plasma machining workpiece surfaces.

An apparatus for ion-plasma machining workpieces comprises a vacuum chamber 1 (FIG. 1) accommodating a source 2 of ion flow, and a system 3 for decelerating ion flow with workpieces 4 located therein. The system 3 includes a shielding electrode 5 in the form of a box-shaped housing containing decelerating electrodes 6 with the workpieces 4 secured thereon. Provided in the wall of the shielding electrode 5 facing the workpiece surface being machined is a hole 7 for the passage of ion flow. Each decelerating electrode 6 has the form of a magnetic element orientated relative to the surface of the workpiece 4 being machined so that vector $\bar{M}$ of magnetization thereof is substantially congruent with this surface. The apparatus can include a source 8 of direct current whose positive terminal is connected to the decelerating electrode 6, whereas its negative terminal is connected to the shielding electrode 5. In the absence of source 8 the decelerating electrode 6 will have a positive potential relative to the shielding electrode 5.

In addition, the apparatus can be provided with an electron emitter 9 positioned between the source 2 of ion flow and shielding electrode 5, whereas when using the proposed apparatus for applying coatings to the workpiece surface, sources 10 of atoms of the material of coating, such as evaporator-type sources, are preferably provided.

Figure 2:
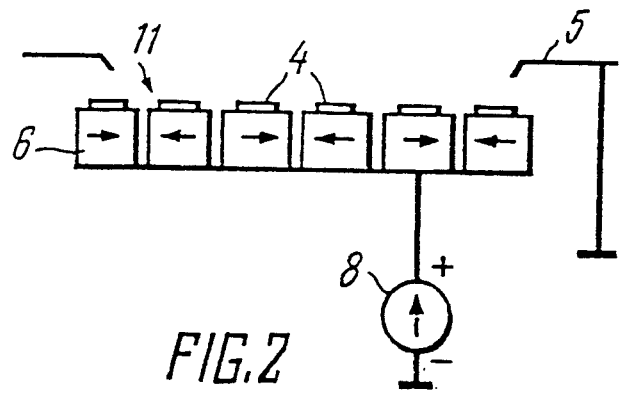
FIG. 2 is a schematic showing the manner in which electrodes of the ion deceleration system are brought into circuit with earthed shielding electrode in the form of a flat membrane.

Referring now to FIG. 2, the shielding electrode 5 can have the form of a substantially flat membrane fabricated from a magnetically soft material with a hole 11 for the passage of ion flow, this shielding electrode 5 can be earthed.

The decelerating electrode 6 (FIG. 3) can be fashioned as a magnetic element fabricated from a magnetically hard material and having the shape of a parallelepiped. Fastening units 12 are located at its side surfaces functioning as magnetic poles, whereas line 13 of electron drift current orthogonal to vector $\bar{B}$ of induction of the magnetic field of the element and parallel to the workpiece surface being machined is closed. Closed state of the electron drift current line 13 is complied with also when the decelerating electrodes 6 (FIGS. 4, 5) are fashioned as magnetic elements of annular shape fabricated from a magnetically hard material and positioned with like magnetic poles toward each other. The decelerating electrodes 6 can alternatively be fabricated from a material posessing high coersive force, such as a SmCo$_6$ alloy, or from a dielectric magnetic material enclosed into a casing 14 (FIG. 3) of electrically conductive non-magnetic material.

Figure 6:
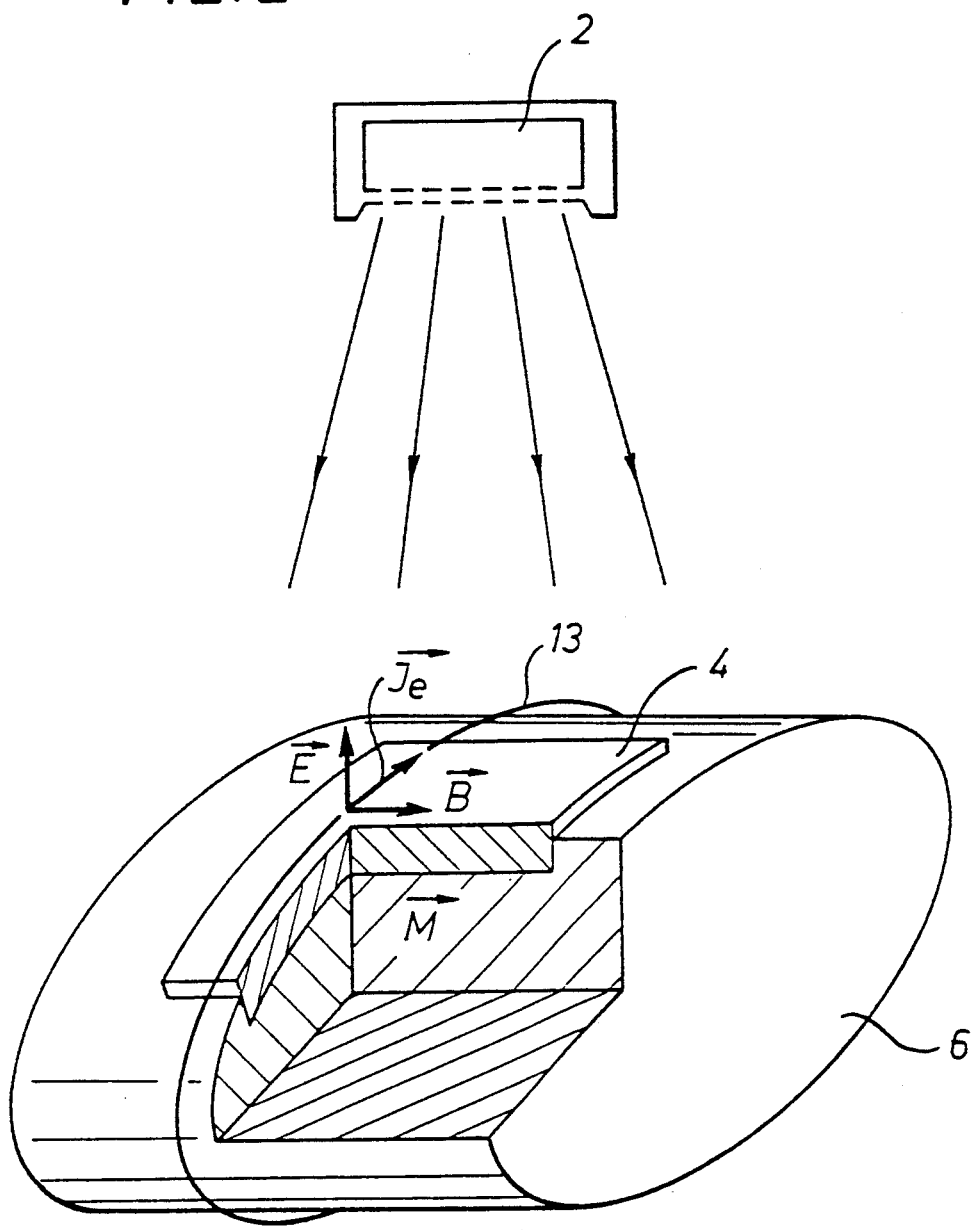
FIG. 6 illustrates a modified form of the ion flow deceleration system with cylindrical decelerating electrode.

The decelerating electrodes 6 (FIG. 6) can be fashioned as a magnetic element having the shape of a cylinder magnetized along its axis. The machining workpiece has substantially the same shape like that of the decelerating electrode so that the magnetization vector $\bar{M}$ of the magnetic element is substantially congruent with the machining surface of the workpiece.

When ionically etching, for example, gallium arsenide crystals, the proposed apparatus operates in the following manner. Upon attaining a vacuum pressure of $\sim 10^{-3}$ Pa, the source 2 of ion flow is energized. Normally, the flow parameters of known ion flow sources are as follows: energy of ions is $eU_o \gtrsim 200$ eV, and density of ion flow is 1 ... 2 mA/cm$^2$.

However, machining gallium arsenide crystals necessitates an ion energy below 40 eV at the same density of ion flow. With this aim in view, a positive potential $U_D \geq (U_o - 40)$ V is applied to the decelerating electrode 6 (FIG. 1) relative to the shielding electrode 5. In this case favourable conditions are brought about in the machining zone for the presence of an electric layer (E-layer) where an electric field acting to decelerate ions is maintained.

Figure 4:
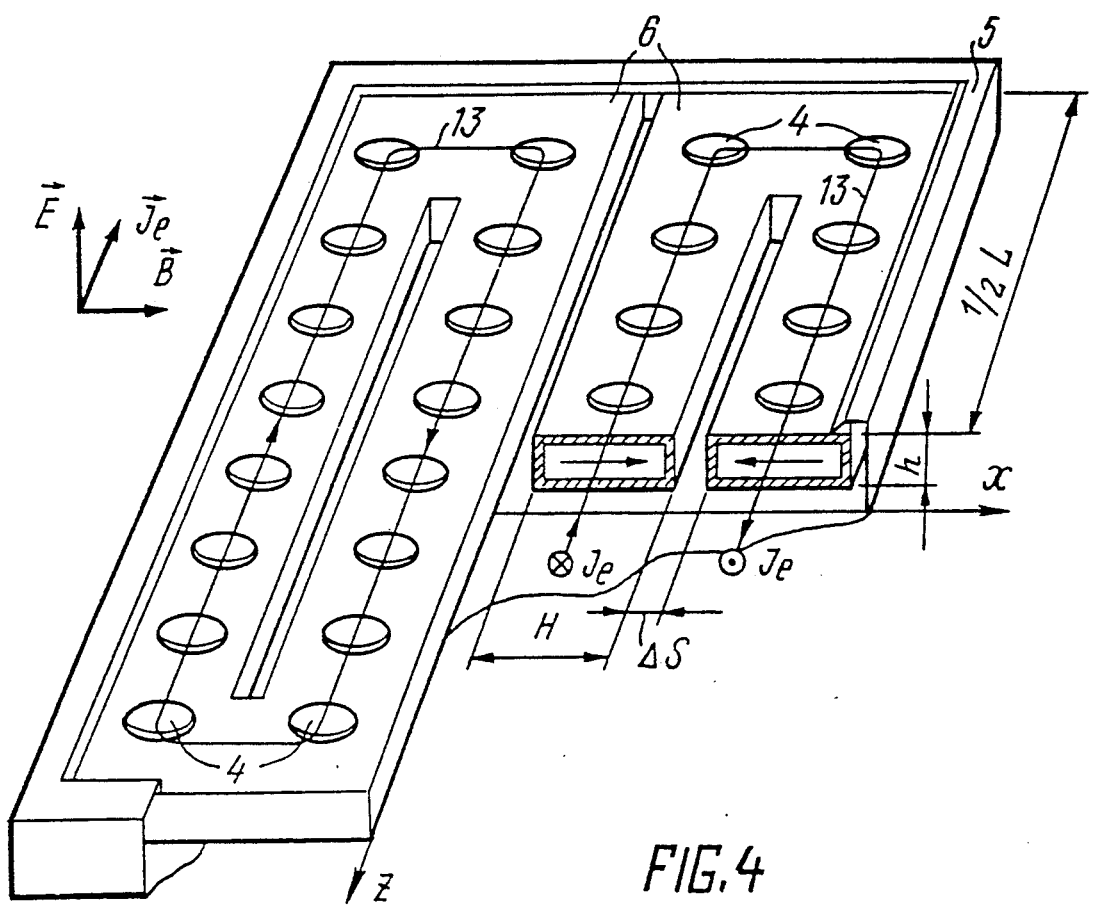
FIG. 4 illustrates a modified form of the ion flow deceleration system with annular decelerating electrodes.
Figure 5:
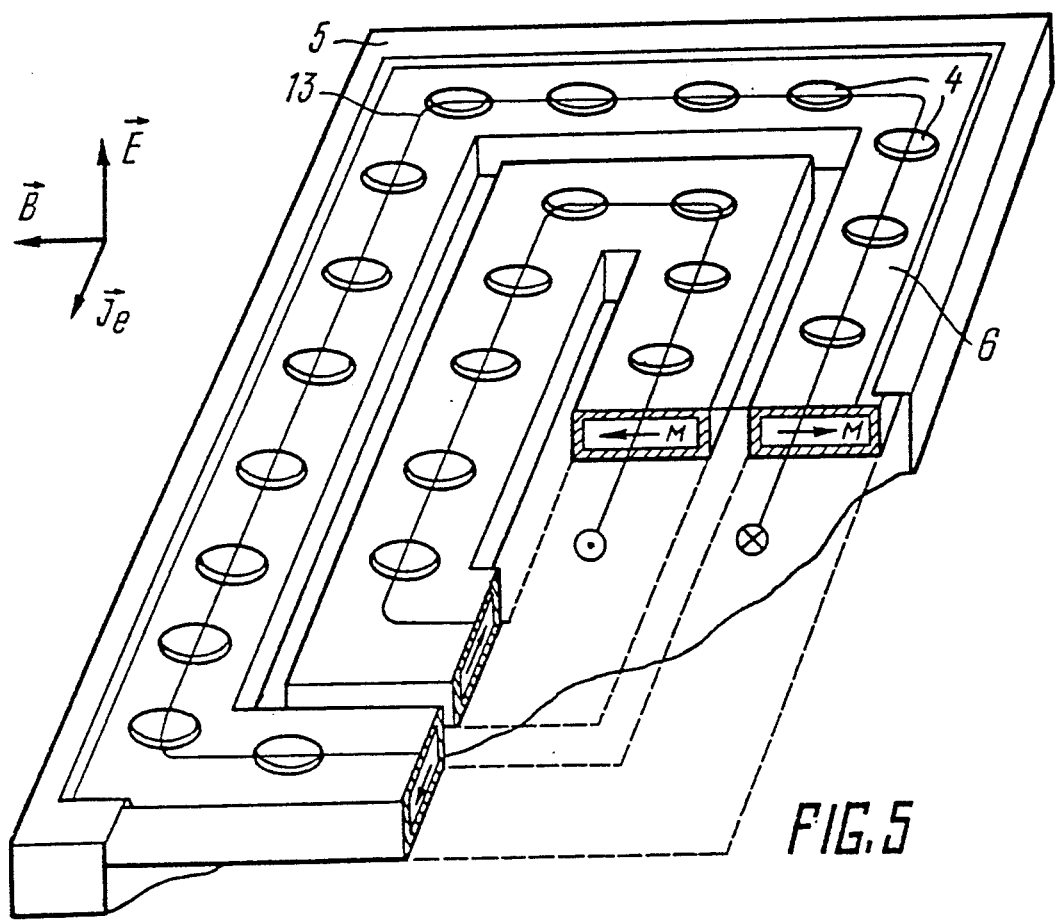
FIG. 5 shows another modified form of the ion flow deceleration system with annular decelerating electrodes.

As follows from the physics of discharge of this type, maintaining the electric field fails to give rise to high energy electron flow onto the workpiece 4 when conditions for closing the line 13 (FIG. 3) of electronic drift current are met:

$$j_e = en_e \frac{[E \times B]}{B^2},$$

where $n_e$ is the concentration of electrons, and square brackets contain a vector product. Lines 13 (FIGS. 3, 4 and 5) of this current coincide with lines parallel with the workpiece surface being machined and perpendicular to vector $\bar{B}$. The direction of crossed vectors $\bar{E}$ and $\bar{B}$ and vector $\bar{j}_e$ orthogonal thereto is represented in FIGS. 3, 4 and 5.

The preferred geometries of magnetic elements ensure closing of line 13 of electron drift current. Experiments have shown that at the level of magnetic induction $\bar{B} \gtrsim 0.05$ Tl the electron current can be equal to or even smaller than the ion current at the rate of ion deceleration of $U_D/U_o = 0.6-0.8$. This in turn ensures that workpieces 4 can be machined by a flow of ions having an energy amounting to 20-40% of the initial energy when they escape from the ion source 2 (FIG. 1).

In the herein proposed constructions the required level of magnetic induction can be achieved for workpieces 4 sizing ≲50 mm using magnetic elements fabricated from a material having high coersive force, such as rare-earth metal alloys, particularly SmCo$_6$. The use of such a material obviates a demagnetization effect in outer magnetic field, which is important for obtaining a magnetic field of preferred topography. Geometrical dimensions L, H, h, ΔS (FIG. 4) are determined from the size of workpieces 4, and also proceeding from obtaining optimized topography of the magnetic field. For example, reduction in the magnitude ΔS/H affects uniformity of magnetic field over the surface of the decelerating electrode 6 leading, for example, to non-uniform machining.

Figure 3:
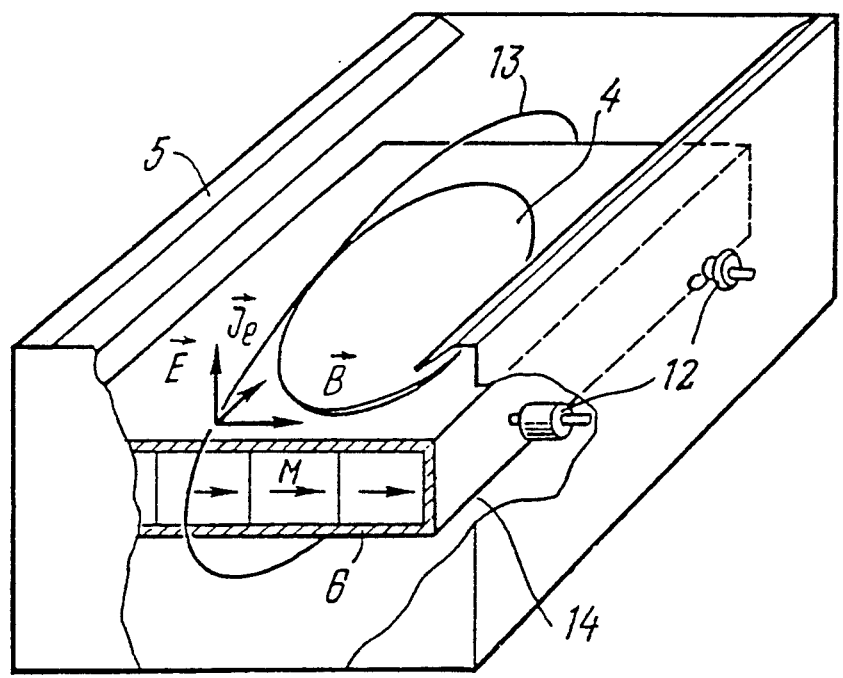
FIG. 3 shows an ion flow deceleration system for piece-by-piece machining workpieces with a shielding electrode in the form of a box-like housing.

The decelerating electrode 6 can be made up of separate prismatic magnets, as shown in FIG. 3, such as those fabricated from a dielectric material. In the latter case for bringing the decelerating electrode 6 into the circuit the magnetic elements are preferably enclosed into casing 14 (FIG. 3) made of an electrically conductive material. The decelerating electrode 6 can be made up in the shape of cylinder (FIG. 6) for machining non-plane workpieces. If the shape of the decelerating electrode is such that the surfaces of the workpiece and the electrodes are mainly equidistant, the magnetization vector ($\overline{M}$) will be substantially congruent with the machining surface of the workpiece. The workpieces of different non-plane forms can be machined by analogous methods. One major modifying feature of the proposed apparatus is the use of electron emitter 9 (FIG. 1) enabling to control the balance of electrons in the ion flow and potential of secondary plasma induced by the ion beam. This allows to weaken the effect of beam closing by a volumetric charge of ions and, other conditions being equal, to increase the density of ion flow in the machining zone and ensure a more stable operation.

In order to carry out a group of processes associated with obtaining dense metal layers on a dielectric substrate by depositing a flow of atoms of metal accompanied by bombarding the substrate with a low energy ion flow it is advantageous to provide the apparatus with sources 10 of atom flows of the coating material of one of the known type, such as the evaporator type. Experiments have shown that stable operation of the system "source of ion flow 2—ion deceleration system 3" depends on the balance of electrons in the beam where secondary electrons formed in the flow volume and at the walls of the vacuum chamber 1 are very important. The rate of formation of these secondary electrons depends on the type of working gas and its pressure in the chamber 1. Depending on the aforedescribed conditions, it could be preferable to use either the system with a floating potential of the shielding electrode 5 wherein the flow of electrons toward this electrode 5 is automatically determined by the magnitude of ionic flow onto the same electrode 5, or the system with an earthed shielding electrode 5 (FIG. 2) when the flow of electrons is determined not only by stationary, but also by stochastic balance conditions.

For ensuring a higher stability in operation of the proposed apparatus through reducing its susceptibility to breakdowns in the deceleration system 3 it is advantageous to fashion the shielding electrode 5 (FIG. 1) as a box-shaped housing. In this case the outer plasma induceable by the flow of ions in the media of residual gas fails to penetrate to the area of fastening of the decelerating electrodes 6.

The invention makes it possible to expand production capabilities of the apparatus for ion-plasma machining workpiece surfaces through reducing the lower level of ion energy to 30–50 eV, which makes the proposed apparatus amenable to novel technologies.

What is claimed:

1. An apparatus for ion-plasma machining workpiece surfaces, the apparatus including a workpiece (4) to be machined, the apparatus comprising a vacuum chamber (1) accommodating a source (2) of ion flow oriented toward the workpiece surface being machined, characterized in that the apparatus is provided with a system (3) for decelerating ion flow, the system including closed electron drift current, the system comprising
   a shielding electrode (5) having a hole (7) for the passage of ion flow to workpiece surface machining zone,
   at least one decelerating electrode (6) electrically insulated from the walls of the vacuum chamber (1) and from shielding electrode (5), the decelerating electrode comprising a magnetic whose magnetization vector (M) is substantially parallel with the surface of workpiece (4) secured thereon, and
   wherein the lines of electron drift current are substantially transverse to the direction of the ion flow.

2. An apparatus for ion-plasma machining workpiece surfaces as claimed in claim 1 characterized in that the decelerating electrode (6) is fashioned as a magnetic element fabricated from a magnetically hard material in the form of a rectangular prism, fastening units (12) thereof in the vacuum chamber (1) being positioned at least at one of its magnetic poles.

3. An apparatus for ion-plasma machining workpiece surfaces as claimed in claim 1 further comprising a plurality of decelerating electrodes (6), wherein each such electrode is fashioned as a magnetic element of annular shape fabricated from a magnetically hard material, such elements being positioned with like magnetic poles toward each other.

4. An apparatus for ion-plasma machining workpiece surfaces as claimed in claim 1, characterized in that the decelerating electrode (6) is fabricated from a material posessing high coersive force.

5. An apparatus for ion-plasma machining workpiece surfaces as claimed in claim 4, characterized in that the material possessing high coercive force is SmCo$_6$.

6. An apparatus for ion-plasma machining workpiece surfaces as claimed in claim 1, characterized in that the decelerating electrode (6) is fabricated from a dielectric magnetic material, this electrode being enclosed into a casing (14) fabricated from an electrically conductive non-magnetic material.

7. An apparatus for ion-plasma machining workpieces as claimed in claim 1, characterized in that the shielding electrode (5) has the form of a flat membrane positioned in front of the workpiece surface being machined.

8. An apparatus for ion-plasma machining workpiece surfaces as claimed in claim 1, characterized in that the shielding electrode (5) has the form of a box-like housing accommodating at least one decelerating electrode (6), the hole (7) for the passage of ion flow being provided in a wall facing the workpiece surface being machined.

9. An apparatus for ion-plasma machining workpiece surfaces as claimed in claim 7, characterized in that the shielding electrode (5) is fabricated from a magnetically soft ferromagnetic material.

10. An apparatus for ion-plasma machining workpiece surfaces as claimed in claim 1, characterized in that it is provided with an electron emitter (9) positioned between the ion flow source (2) and shielding electrode (5).

11. An apparatus for ion-plasma machining workpiece surfaces as claimed in claim 1, characterized in that it has a source (8) of direct current whose positive terminal is connected to the decelerating electrode (6), and negative terminal is connected to the shielding electrode (5).

12. An apparatus for ion-plasma machining workpiece surfaces as claimed in claim 11, characterized in that the shielding electrode (5) is grounded.

13. An apparatus for ion-plasma machining workpiece surfaces as claimed in claim 1, further comprising at least one source (10) of atoms of a predetermined material orientated toward the workpiece surface being machined.

* * * * *